(12) United States Patent
Raghuram et al.

(10) Patent No.: US 7,517,796 B2
(45) Date of Patent: Apr. 14, 2009

(54) METHOD FOR PATTERNING SUBMICRON PILLARS

(75) Inventors: Usha Raghuram, San Jose, CA (US); Michael W. Konevecki, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 11/061,952

(22) Filed: Feb. 17, 2005

(65) Prior Publication Data

US 2006/0183282 A1    Aug. 17, 2006

(51) Int. Cl.
*H01L 21/44* (2006.01)

(52) U.S. Cl. .................. 438/666; 438/668; 438/672; 438/947

(58) Field of Classification Search ............. 438/947, 438/666–675
See application file for complete search history.

(56) References Cited

U.S. PATENT DOCUMENTS

| | | | | |
|---|---|---|---|---|
| 5,120,421 A | * | 6/1992 | Glass et al. | 204/406 |
| 5,902,133 A | * | 5/1999 | Linliu | 438/717 |
| 5,976,769 A | * | 11/1999 | Chapman | 430/316 |
| 6,200,736 B1 | * | 3/2001 | Tan | 430/319 |
| 6,869,899 B2 | * | 3/2005 | Mahorowala et al. | 438/587 |
| 6,878,646 B1 | * | 4/2005 | Tsai et al. | 438/756 |
| 6,900,139 B1 | * | 5/2005 | Dakshina-Murthy et al. | 438/725 |
| 6,955,961 B1 | * | 10/2005 | Chung | 438/241 |
| 2004/0043623 A1 | * | 3/2004 | Liu et al. | 438/736 |
| 2006/0169968 A1 | * | 8/2006 | Happ | 257/2 |

* cited by examiner

*Primary Examiner*—H. Jey Tsai
(74) *Attorney, Agent, or Firm*—Dugan & Dugan, PC

(57) ABSTRACT

The present invention provides for a method to pattern and etch very small dimension pillars, for example in a memory array. When dimensions of pillars become very small, the photoresist pillars used to pattern them may not have sufficient mechanical strength to survive the photoresist exposure and development process. Using methods according to the present invention, these photoresist pillars are printed and developed larger than their intended final dimension, such that they have increased mechanical strength, then are shrunk to the desired dimension during a preliminary etch performed before the etch of underlying material begins.

21 Claims, 8 Drawing Sheets

METHOD FOR PATTERNING SUBMICRON PILLARS

BACKGROUND OF THE INVENTION

The invention relates to a method to pattern and etch submicron pillars using photolithography and etch techniques.

In semiconductor devices it may be necessary to pattern and etch submicron pillars. An example is found in Herner et al., U.S. patent application Ser. No. 10/326,470, hereinafter the '470 application (since abandoned), herein incorporated by reference, which requires an array of pillars having submicron dimensions to be formed using conventional photolithography and etch processes. Photoresist is patterned and developed into photoresist features, which are then etched into an underlying material. Even at very small critical dimensions (CDs), photoresist lines are mechanically strong enough to survive the exposure, development, and the cleaning and drying process that follows before the etch is performed. At the same CDs, however, photoresist pillars have less mechanical strength and may topple before the etch can be performed.

There is a need, therefore, for a method to pattern and etch very small pillars using standard photolithography and etch methods.

SUMMARY OF THE PREFERRED EMBODIMENTS

The present invention is defined by the following claims, and nothing in this section should be taken as a limitation on those claims. In general, the invention is directed to a method to pattern and etch very small dimension pillars.

A first aspect of the invention provides for A method for forming a reduced CD pillar, the method comprising forming a layer of etchable material; forming a layer of photoresist over the etchable material; patterning and developing the photoresist layer to form a photoresist pillar, the photoresist pillar having a first width no larger than about 0.3 micron; shrinking the photoresist pillar to a second width smaller than the first width; and etching the etchable material to form an etched pillar.

Another aspect of the invention provides for a method for etching reduced CD pillars, the method comprising forming a layer of etchable material; forming a layer of photoresist over the etchable material; patterning and developing the photoresist layer to form a plurality of photoresist pillars, each photoresist pillar having a largest surface dimension equal to a first width, the first width no larger than about 0.3 micron; before etching the etchable material, shrinking the photoresist pillars until the largest surface dimension is a second width less than the first width; and etching the etchable material to form etched pillars.

Yet another aspect of the invention provides for a method for forming a memory array, the method comprising forming a layer of etchable material; forming a layer of photoresist over the etchable material; patterning and developing the photoresist to form a plurality of photoresist features, each photoresist feature having a largest patterned dimension about equal to a first width, the first width less than about 0.3 micron; shrinking the photoresist features to a shrunk width, the shrunk width smaller than the first width; etching etched features in the etchable material; and forming the memory array comprising a plurality of memory cells, wherein each memory cell comprises one of the etched features.

An embodiment of the invention provides for a method for forming a monolithic three dimensional memory array, the method comprising a) forming a first memory level by a method comprising i) forming a first etchable layer; ii) forming a photoresist layer over the first etchable layer; iii) patterning and developing the photoresist layer to form photoresist pillars, each pillar having about a first width; iv) shrinking the photoresist pillars until each pillar has about a second width, the second width less than the first width; and v) etching the first etchable layer to form etched pillars; and b) monolithically forming a second memory level above the first memory level.

A related embodiment of the invention provides for a monolithic three dimensional memory array comprising a) a first memory level formed over a substrate by a method comprising: i) forming a layer of polycrystalline or amorphous silicon; ii) depositing photoresist above the polycrystalline or amorphous silicon layer; iii) patterning and developing the photoresist to form a plurality of photoresist pillars arranged in an evenly spaced grid pattern, the largest patterned dimension of each pillar having about a first width; iv) before substantially etching the layer of polycrystalline or amorphous silicon, reducing the first width to a second width less than the first width; and v) etching the layer of polycrystalline or amorphous silicon to form etched silicon pillars; and b) a second memory level monolithically formed on the first level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
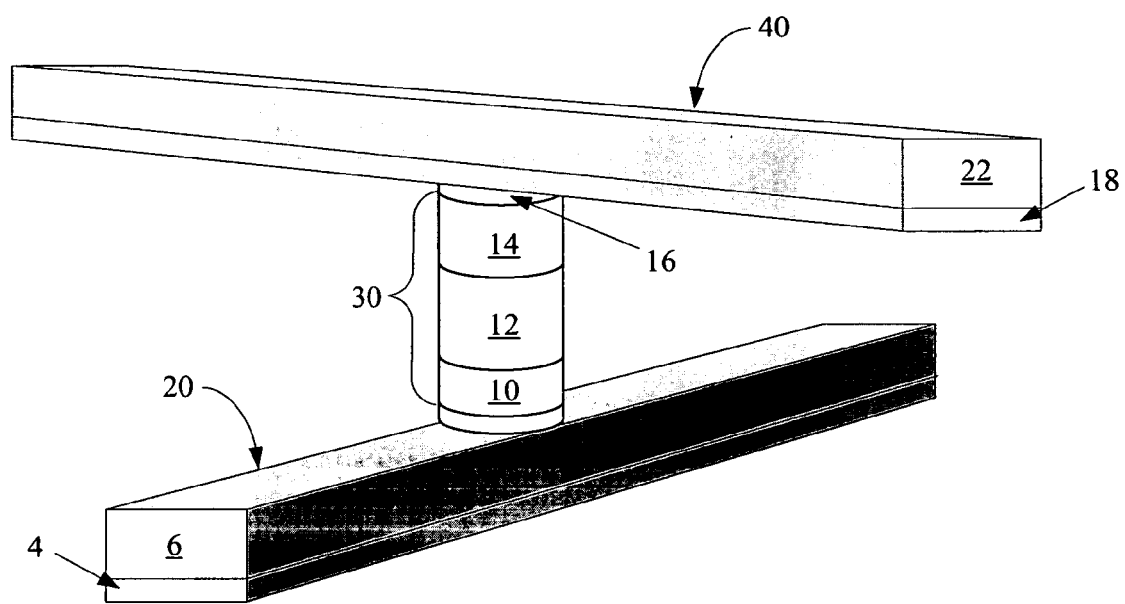
FIG. 1 is a perspective view illustrating a prior art memory cell according to the '470 application.

The well-known techniques of photolithography and etch are used to pattern features in semiconductor devices. This process begins with a photomask blank, typically made from quartz and coated with an opaque material like chrome. To make a photomask, the chrome is etched, leaving behind the desired pattern in chrome.

On a substrate, typically a wafer, a layer of the material that is to be etched into the desired pattern is deposited or grown on a surface, typically over a monocrystalline silicon wafer. This layer of material, in which the patterned features are ultimately intended to be formed, will be referred to in this discussion as the target layer. A layer of photoresist, a photoactive material, is deposited above the target layer. During exposure, the photomask transmits light where the chrome has been etched away and blocks it where the chrome remains, so some areas of photoresist are exposed to light, while others are not. Scaling takes place during this exposure or printing process: A feature in the photomask is typically about four or five times the size of the corresponding printed feature.

Photoresist is chemically changed by exposure to light. Exposure is followed by a development process, in which the exposed photoresist is chemically removed, while the unexposed photoresist remains. At this point the photomask pattern that was etched in chrome has been transferred to photoresist features.

The next step is an etch step, in which the surface is exposed to an etchant that will etch the target layer. Target layer material covered by photoresist features is protected from the etchant, while the exposed areas are etched away. In this way the pattern of the photoresist features is finally transferred to the target layer.

A variety of factors affect the smallest patterned width or CD of the photoresist features that can be formed by exposure and development. The time and light energy used during exposure is called the dose, and a higher dose will produce smaller CDs. The development process can be allowed to proceed for a shorter or longer time, where more developing time results in smaller CDs.

It is also possible, after the development process is complete, to use a preliminary etch, before the actual etch of the target material starts, to reduce the CD of photoresist features, typically used to reduce the width of patterned lines. Such CD reduction, which takes place after printing and developing of the photoresist but before etch of the target layer, will be referred to as CD shrink.

The CD of patterned features, for example the width of patterned lines, is generally limited by the wavelength of the light used during printing. Features smaller than a half-wavelength cannot be successfully resolved in the printing step. The methods of altering dose, development time, and CD shrink have been used to create photoresist lines with a width narrower than the width that can be successfully printed.

CD shrink has traditionally been used to reduce line widths in logic devices. Shrinking gate length, for example, makes for faster turn-on times for devices.

The '470 application describes a monolithic three dimensional memory array having multiple stacked memory levels formed above a substrate. Each memory level comprises densely packed memory cells like those shown in FIG. 1. A vertically oriented diode 30 and antifuse 16 in series are disposed between a bottom conductor 20 and a top conductor 40. Top and bottom conductors 20 and 40 preferably comprise adhesion layers 4 and 18, respectively, preferably of titanium nitride, and conductive layers 6 and 22, respectively, preferably of tungsten. The diode is formed of a polycrystalline semiconductor material such as silicon, and is in the form of a pillar. Variations on this memory cell are described in Herner et al., U.S. application Ser. No. 10/955,549, "Nonvolatile Memory Cell Without a Dielectric Antifuse Having High- and Low-Impedance States," filed Sep. 29, 2003 and hereinafter the '549 application; Herner et al., U.S. application Ser. No. 10/954,577, "Junction Diode Comprising Varying Semiconductor Compositions," filed Sep. 29, 2004 and hereinafter the '577 application; and Herner et al., U.S. application Ser. No. 11/015,824, "Nonvolatile Memory Cell Comprising a Reduced Height Vertical Diode," filed Dec. 17, 2004, and hereinafter the '824 application, all hereby incorporated by reference.

Figure 2A:
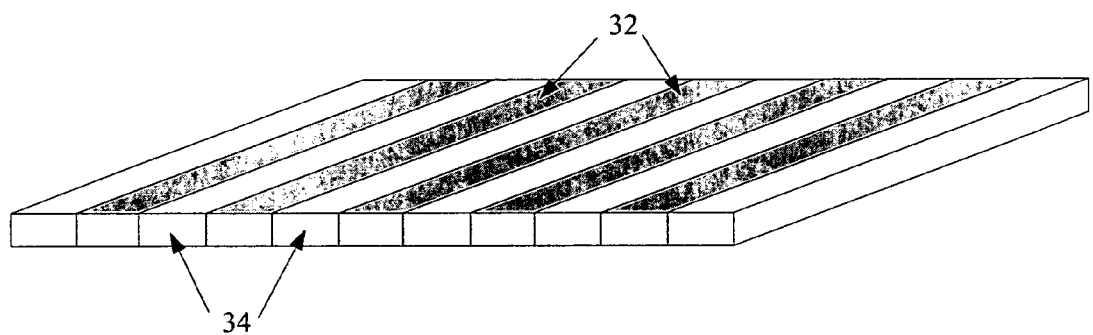
FIGS. 2a and 2b are perspective views illustrating formation of a plurality of patterned pillars formed above and aligned with a plurality of patterned rails.

Turning to FIG. 2a, to form a memory level of the cells described in any of these applications, a plurality of first conductors is formed, for example by depositing a conductive stack, then patterning and etching that stack to form a plurality of substantially parallel, substantially coplanar bottom conductors 32. Tungsten is an advantageous material for use in bottom conductors 32. A dielectric material 34 is deposited over and between bottom conductors 32, filling the gaps between them. Planarization is performed, for example by chemical mechanical planarization (CMP), to remove overfill of dielectric material, and to coexpose dielectric material 34 and bottom conductors 32.

Figure 2B:
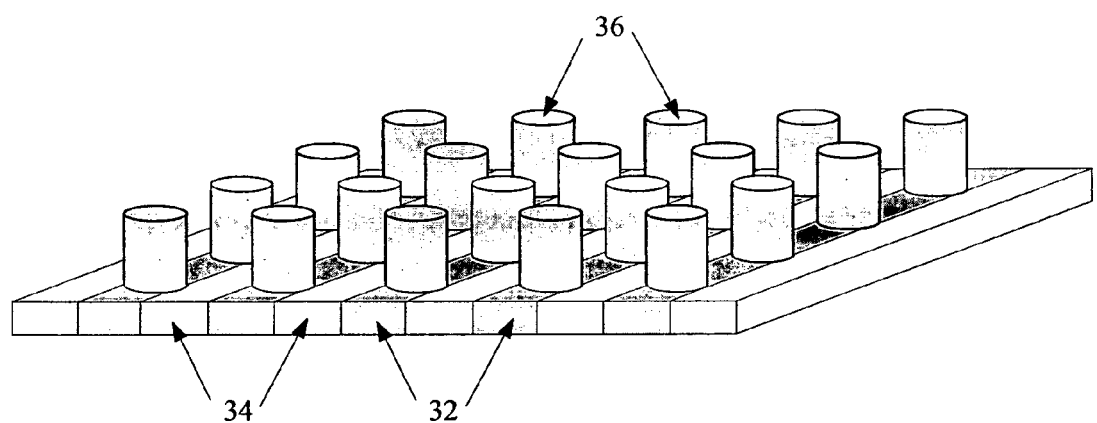

Next a stack of semiconductor material, for example silicon, is deposited, then patterned and etched to form a plurality of pillars 36. (A barrier layer, for example of titanium nitride, may be formed between each pillar 36 and the underlying bottom conductor 32. The barrier layer is not shown.) The resulting structure is shown in FIG. 2b. Next dielectric material (not shown) is deposited over and between the pillars 36, filling the gaps between them. A planarizing stop is performed, for example by CMP, to remove overfill of dielectric material and to expose the tops of pillars 36.

To complete the memory level top conductors (not shown) will be formed as bottom conductors 34 were formed, by depositing and patterning conductive material into substantially parallel, substantially coplanar top conductors, which are preferably substantially perpendicular to bottom conductors 34.

Figure 3A:
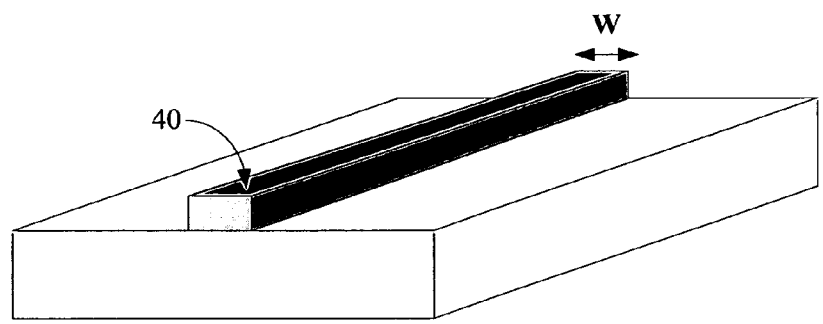
FIGS. 3a and 3b are perspective views showing a photoresist line and pillar.
Figure 3B:
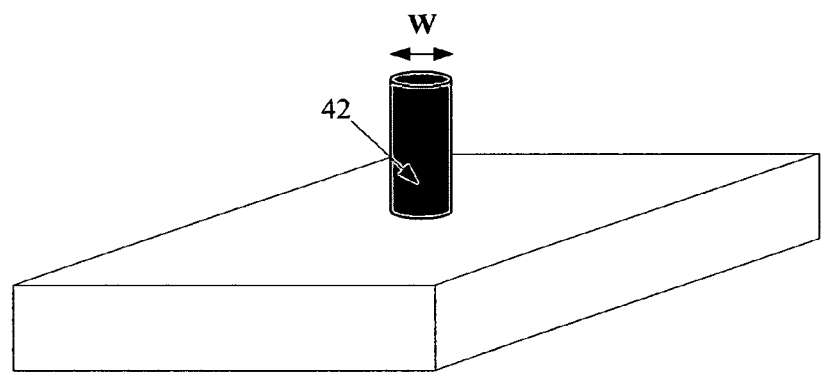

Patterning and etching pillars like the semiconductor pillars 36 shown in FIG. 2b at submicron dimensions is unconventional and introduces new challenges. FIG. 3a shows a patterned photoresist line 40 with having width W. FIG. 3b shows a photoresist pillar 42 having the same width W. Both the photoresist line 40 and the photoresist pillar 42 are shown after exposure and development. The long dimension of photoresist line 40 gives it more mechanical strength than photoresist pillar 42. To stop the developing process, the wafer is conventionally sprayed with deionized water, then spun dry. Photoresist pillar 42 is subjected to mechanical stresses during this wash and spin that make it susceptible to mechanical failure, and photoresist pillar 42 may topple or slump. Photoresist line 40 is stronger and less vulnerable to such failure.

The photoresist pillar 42 could be strengthened by making it shorter, reducing its aspect ratio. Reducing the thickness of photoresist has the disadvantage, however, that less photoresist remains to protect the underlying material when it is to be etched; some amount of photoresist is normally consumed during this etch.

Patterning submicron pillars thus introduces the new problem that photoresist pillars may not have mechanical strength sufficient to survive the process of photoresist exposure and development. The techniques of CD shrink, performing a preliminary etch to reduce the width of a photoresist pillar after exposure and development are complete, can be used to address this new problem.

In aspects of the present invention, pillars are exposed and developed with CDs larger than those eventually desired in the patterned pillars. The larger photoresist pillars formed after exposure and development are mechanically stronger and less prone to slumping. Additionally, better pattern fidelity is achieved when printing with larger CDs.

Figure 3C:
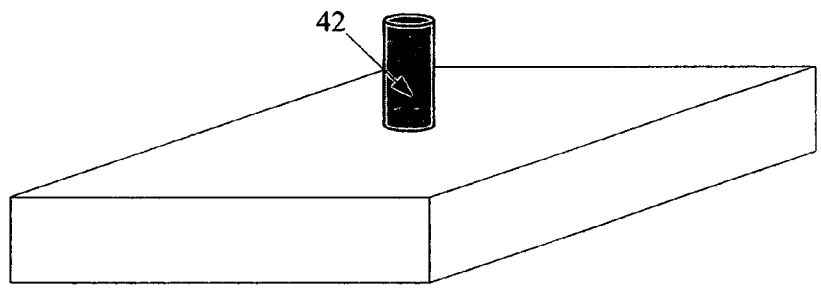
FIGS. 3c and 3d show the same photoresist pillar after CD shrink and after etch of the underlying material.
Figure 3D:

Once the developing process is finished, the etch process can begin. A preliminary etch step, which etches the photoresist pillars 42 as in FIG. 3c, is performed. This preliminary etch should have an isotropic component. The narrower pillars are formed in a low pressure environment and are not subject to mechanical stress during this etch, and thus are not prone to slumping despite their high aspect ratio. Once the CD of the photoresist pillar has been sufficiently reduced, a second etch is performed to etch target layer 44 at the reduced CD, as shown in FIG. 3d. Had the etch of target layer 44 been performed using the original larger size of the photoresist pillars, in an equally spaced array of such pillars, gaps between the pillars would have higher aspect ratios, increasing the difficulty of filling those gaps, and the pillars patterned in target layer 44 would be prone to bridging defects.

To summarize, what has been described is a method for forming a reduced CD pillar, the method comprising forming a layer of etchable material; forming a layer of photoresist over the etchable material; patterning and developing the photoresist layer to form a photoresist pillar, the photoresist pillar having a first width no larger than about 0.3 micron; shrinking the photoresist pillar to a second width smaller than the first width; and etching the etchable material to form an etched pillar.

The pillars shown in the figures of this discussion in general appear to be substantially cylindrical. Rectangular features formed with feature size in both dimensions less than about 0.25 micron using standard photomasking techniques tend to be substantially cylindrical, regardless of the shape of the corresponding feature in the photomask. Below this dimension, current photolithography techniques tend to round any sharp corners on features. It is believed that this rounding occurs because photons used in the process diffract around the features in the photomask.

A pillar, as the word is used in this discussion, is distinct from a line in that no width of the cross-section (parallel to the wafer surface) in any direction is more than three times the width of the cross-section in any other direction. A patterned pillar is also relatively small, such that no surface dimension of a pillar is greater than about 0.3 micron. As will be seen, in most preferred embodiments, no surface dimension of a pillar is greater than about 0.25 micron.

Figure 4A:
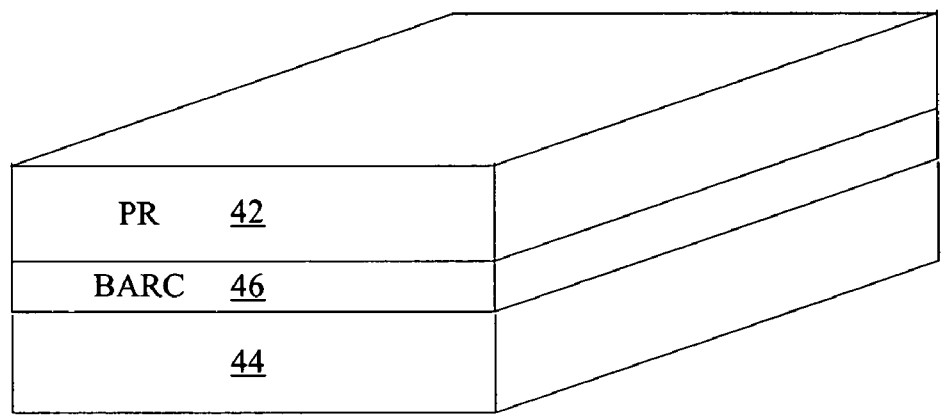
FIGS. 4a through 4c are perspective views illustrating CD shrink of pillars according to a preferred embodiment of the present invention.
Figure 4B:
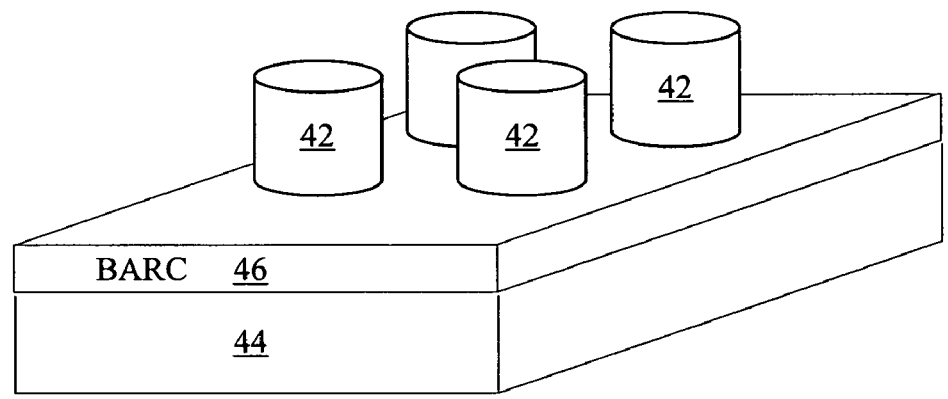
Figure 4C:
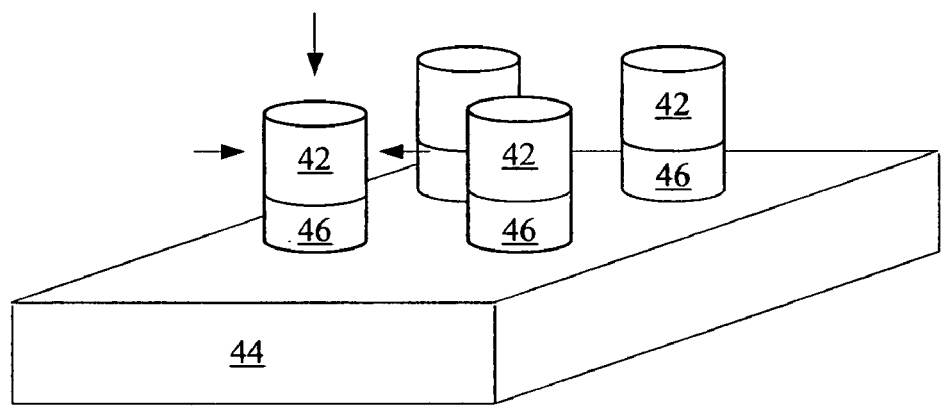

In one particularly advantageous embodiment, shown in FIG. 4a, target layer 44 is deposited first, followed by a layer of bottom antireflective coating (BARC) 46, then by a layer of photoresist 42. Photoresist 42 is exposed and developed into oversize pillars 42, shown in FIG. 4b. BARC is conventionally used to prevent reflection during printing. BARC layer 46, of course, must be etched before target layer 44 can be etched. The etch chemistries of BARC and of photoresist are very similar, so it is possible to etch BARC layer 46 and shrink photoresist pillars 42 in the same etch step, with the result shown in FIG. 4c. Arrows indicate that this etch with an isotropic component has caused shrinkage of the photoresist pillars 42 in both height and width. This etch should be selective, with a high etch rate for photoresist and BARC but a very low etch rate for the material of target layer 44.

BARC is conventionally used to prevent unwanted exposure from reflection. Use of BARC in embodiments of the present invention provides the extra advantage that in the following etch, the additional thickness of the BARC helps compensate for photoresist thickness lost during the CD shrink etch.

A detailed example will be provided describing fabrication of a memory level of a monolithic three dimensional array like the array of the '470 application, the '549 application, the '577 application, or the '824 application. Fabrication of this memory level will include pattern and etch of polysilicon pillars according to embodiments of the present invention. For completeness, specific details regarding materials, steps, and conditions will be provided. It will be understood by those skilled in the art, however, that many of these details can be modified, omitted, or augmented while the result still falls within the scope of the invention.

EXAMPLE

Fabrication of a single memory level is described. Additional memory levels can be stacked, each monolithically formed above the one below it.

Figure 5A:
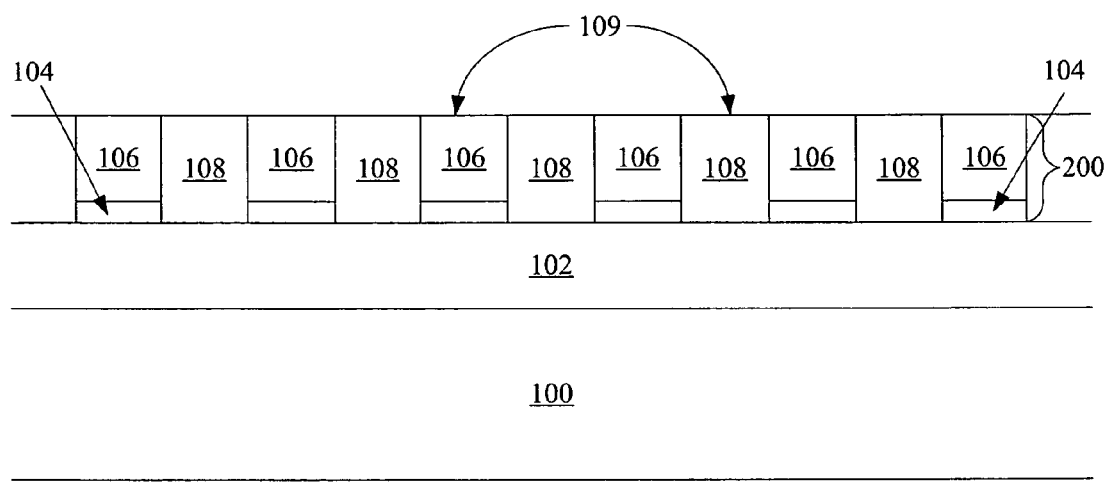
FIGS. 5a through 5f are cross-sectional views illustrating steps in formation of a memory level in a monolithic three dimensional memory array in which a plurality of pillars is patterned and etched according to embodiments of the present invention.

Turning to FIG. 5a, formation of the memory begins with a substrate 100. This substrate 100 can be any semiconducting substrate as known in the art, such as monocrystalline silicon, IV-IV alloys like silicon-germanium or silicon-germanium-carbon, III-V alloys, II-VII alloys, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer 106 is tungsten, titanium nitride is preferred as an adhesion layer.

The next layer to be deposited is conducting layer 106. Conducting layer 106 can comprise any conducting material known in the art, including tantalum, titanium, tungsten, copper, cobalt, or alloys thereof. Titanium nitride may be used.

Once all the layers that will form the conductor rails have been deposited, the layers will be patterned and etched using any suitable masking and etching process to form substantially parallel, substantially coplanar conductors 200, shown in FIG. 5a in cross-section. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 5a. This removal of dielectric overfill to form planar surface 109 can be performed by any process known in the art, such as chemical mechanical planarization (CMP) or etchback. At this stage, a plurality of substantially parallel first conductors have been formed at a first height above substrate 100.

Figure 5B:
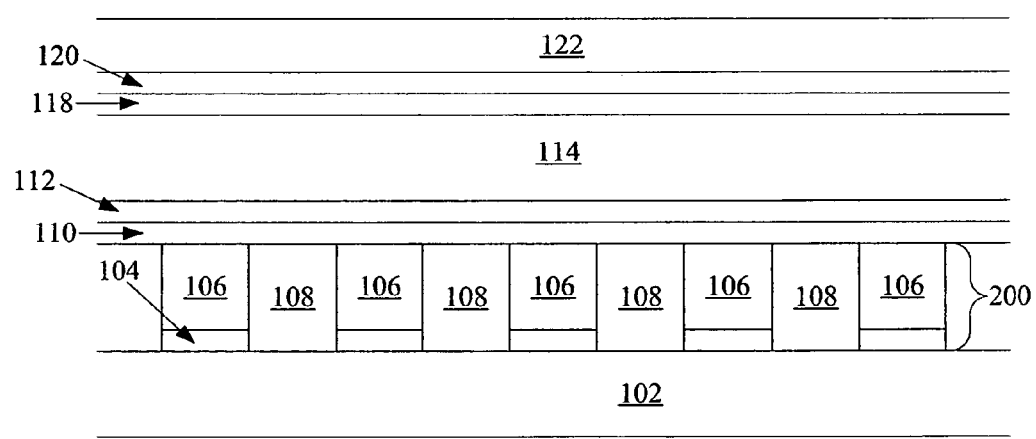

Next, turning to FIG. 5b, vertical semiconductor pillars will be formed above completed conductor rails 200. (To save space substrate 100 is omitted in FIG. 5b; its presence will be assumed.) If conductive material 106 was tungsten, it is preferred to deposit barrier layer 110, preferably of titanium nitride, after planarization of the conductor rails. This layer can be formed in any conventional manner. Its thickness can be, for example, about 20 to about 500 angstroms. The thickness of barrier layer 110 is preferably about 200 angstroms.

Next semiconductor material that will be patterned into pillars is deposited. The semiconductor material can be silicon, silicon-germanium, silicon-germanium-carbon, germanium, or other suitable semiconductors or alloys. Silicon is commonly used in the industry, so, for simplicity, this description will refer to the semiconductor material as silicon, but it will be understood that other materials may be substituted.

In preferred embodiments, the semiconductor pillar is a junction diode, comprising a bottom heavily doped region of a first conductivity type and a top heavily doped region of a second conductivity type. The middle region, between the top and bottom regions, is an intrinsic or lightly doped region of either the first or second conductivity type. The diode of FIG. 6a has a bottom region 112 of P+ silicon, intrinsic region 114, and N+ top region 116. The diode of FIG. 6b is reversed, having a bottom region 112 of N+ (heavily doped n-type) silicon, intrinsic region 114, and P+ top region 116. The middle region is intrinsic, or not intentionally doped, though in some embodiments it may be lightly doped. An undoped region will never be perfectly electrically neutral, and will always have defects or contaminants that cause it to behave as if slightly n-doped or p-doped. Such a diode can be considered a p-i-n diode.

Figure 6A:
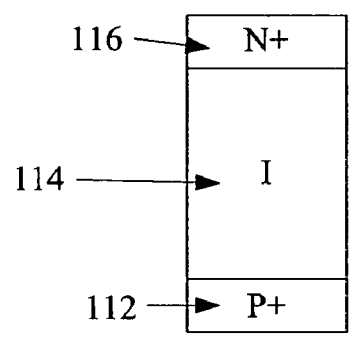
FIGS. 6a and 6b are cross-sectional views illustrating polarities of diodes that may be used in a monolithic three dimensional memory array.
Figure 6B:
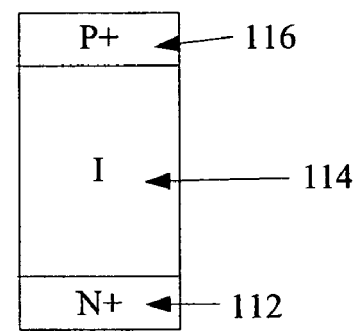

To form, for example, the diode of FIG. 6a, a layer of heavily doped n-type silicon 112 must be formed, shown in FIG. 5b. This layer can be formed by any deposition and doping method known in the art. The silicon can be deposited and then doped, but is preferably doped in situ by flowing a donor gas providing dopant atoms during deposition of the silicon. In a preferred embodiment, this layer can range from about 100 to about 1500 angstroms, preferably 400 angstroms, and have a dopant concentration of about $1 \times 10^{19}$ to about $2 \times 10^{21}$ atoms/cm$^3$, and preferably about $8 \times 10^{20}$ atoms/cm$^3$.

In preferred embodiments, layers 114 and 116 are deposited in a single deposition step. These layers are deposited as intrinsic, undoped silicon; in preferred embodiments, silicon is deposited without intentional doping, yet has defects which render it slightly n-type. Layers 114 and 116 together have a thickness of between about 1400 and about 4000 angstroms, preferably about 3300 angstroms. Note this is the thickness as-deposited. Some portion of the top of this layer, for example about 800 angstroms, will be consumed in a subsequent CMP or etchback step, and will thus be thinner in the finished device. Heavily doped layer 116 will be differentiated from intrinsic layer 114 in a later ion implantation step, described below. As there is no distinction between layers 114 and 116 at this point, only layer 114 is labeled in FIG. 5b.

In preferred embodiments a material that will act as a hard mask during the polysilicon etch is deposited next, for example silicon dioxide layer 118. This layer is preferably between about 200 to about 800 angstroms thick, more preferably about 400 angstroms thick. A layer 120 of BARC is deposited on silicon dioxide layer 118. The thickness of the BARC is as preferably between about 200 and about 1000 angstroms, most preferably about 600 angstroms. Finally photoresist layer 122 is deposited on BARC layer 120. The thickness of photoresist layer 122 is between about 1500 and about 6000 angstroms, preferably about 4000 angstroms.

Figure 5C:
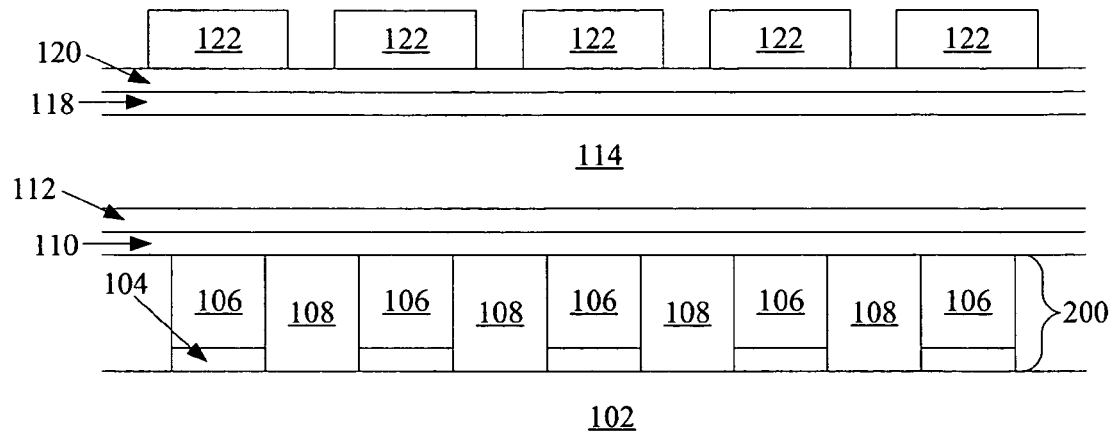

Turning to FIG. 5c, using conventional photolithography methods, photoresist layer 122 is exposed and developed, forming photoresist pillars 122. In preferred embodiments, photoresist pillars 122 are arranged in an evenly spaced grid pattern. The term grid pattern means a pattern in which the pillars are equally spaced in two directions, the direction preferably substantially perpendicular to each other. Spacing in such a pattern is preferably substantially equal in each direction, but need not be. Each photoresist pillar will be used to as a template to form a polysilicon diode from polysilicon layers 112, 114, and 116 (this layer still to be formed by implantation step), and each of these vertically oriented diodes will be aligned on one of the lower conductor rails 200. Some misalignment can be tolerated.

Pitch is the distance between adjacent instances of the same feature in a repeating pattern—the distance from the center of one line to the center of the next in an array of evenly spaced lines, for example. A plurality of pillars arranged in an evenly spaced grid pattern thus has two pitches, one in each dimension of the grid.

Thus the pitch of the diodes to be formed in the direction perpendicular to bottom conductor rails 200, and therefore of the photoresist pillars 122, should be substantially the same as the pitch of the bottom conductor rails 200. The pitch of the photoresist pillars 122 in the direction parallel to bottom conductor rails 200 should be substantially the same as the pitch of the top conductor rails, which will be formed in a later step. These top conductor rails preferably will be substantially perpendicular to bottom conductor rails 200 and have the same pitch, though other directions and other pitches may be used instead.

The pitch of photoresist pillars 122 is preferably between about 0.05 and about 1.0 micron, more preferably between about 0.5 micron and about 0.09 micron. In one preferred embodiment, the pitch is between about 0.29 and about 0.35 micron, preferably about 0.32 micron. In another preferred embodiment, the pitch is between about 0.25 and about 0.28 micron, preferably about 0.26 micron. In another preferred embodiment, the pitch is between about 0.16 and about 0.20 micron, preferably about 0.18 micron.

In one example, if the pitch is about 0.32 micron, for example, the critical dimension of a photoresist pillar after exposure and development is between about 0.17 and about 0.20 micron, preferably between about 0.18 and about 0.19 micron, while the gap between pillars 122 is between about 0.13 and about 0.14 micron. In another example, if the pitch is about 0.26 micron, the width of the photoresist pillar 122 after exposure and development is about 0.15 micron, while the gap between pillars 122 is about 0.11 micron. Note that the critical dimension and gap width may vary across an individual wafer. FIG. 5c shows the structure after exposure and development of photoresist.

Next a CD shrink etch is performed. In preferred embodiments, the BARC layer 120 is etched and the CD of photoresist pillars 122 reduced during this etch step. An etch can have varying degrees of isotropy. A perfectly anisotropic etch etches only in the vertical direction, with no horizontal etch, while a perfectly isotropic etch etches vertically and horizontally at the same rate. Using most conventional dry etchants, generally the horizontal etch rate cannot be higher than the vertical etch rate.

It will be recalled that in a preferred embodiment the thickness of BARC layer 120 is about 600 angstroms. The degree of isotropy will be controlled such that the CD of a photoresist pillar 122 is reduced by the desired amount during this 600-angstroms BARC etch. For example, if the width of a 0.18 micron photoresist pillar is to be reduced to 0.16 micron during the BARC etch, then 0.02 micron must be etched horizontally, 0.01 micron from each side of the pillar. Thus in this example the ratio of vertical etch rate (600 angstroms) to horizontal etch rate (0.01 micron, or 100 angstroms) is 6:1.

A combination of HBr and $O_2$ can be used to etch BARC and photoresist. Increasing the proportion of $O_2$ increases the isotropy of this etch. In one example, during the BARC etch, HBr was flowed at about 20 sccm with pressure of about 10 mTorr. Top power was about 250 watts while bottom power was about 50 watts.

In a series of tests, it was found that flowing 5 sccm of $O_2$ with the 20 sccm of HBr produced no appreciable CD reduction when the 600 angstrom BARC etch was complete. A flow of 7 sccm of $O_2$ reduced the width of the pillar by about 15 nm, about 10 sccm of $O_2$ by caused about a 25 nm reduction, about 12 sccm of $O_2$ caused about 30 nm of reduction, about 16 sccm caused about 40 nm, and a flow of about 20 sccm of $O_2$ reduced the width of the pillars by about 50 nm when the 600 angstrom BARC etch was complete. In the present example, then between 7 and 10 would produce the desired reduction of about 20 nm. Other variables, such as equipment used, pressure, temperature, etc., will also affect isotropy. The skilled practitioner will be accustomed to optimizing etch conditions according to equipment, the pattern to be etched, and other usual variables.

Other etchants can be used in place of HBr, for example chlorine and $CF_4$. Increasing the $O_2$ percentage with either of these etchants also allows for a controllable increase in isotropy.

In the example just given, the percentage of $O_2$ is varied to control the degree of isotropy during an etch. Other variables can be used to do so, however, including percentage overetch, pressure, ratio of source power to bias power, and temperature, or any combination of these variables.

If no BARC layer is used, and the CD shrink etch is to be performed on photoresist pillars 122 only without etching any underlying layer, then it is advantageous for the CD shrink etch to be as isotropic as possible to minimize loss of photoresist thickness.

Before the CD shrink etch, the photoresist pillar 122 had a first width. After the CD shrink etch is complete, the photoresist pillar 122 has a second with smaller than the first width. The second width is preferably 95 percent or less of the first width. The second width may be 90 percent or less of the first width, and may be reduced to as much as 80 or even 70 percent of the first width. Even greater reductions are possible if desired.

The second width is preferably at least about 0.01 micron less than the first width, and may be 0.02 micron less than the first width, or as much as 0.04 or 0.06 micron less than the first width. Even greater reductions are possible if desired.

Specifically, if the first width, before the CD shrink etch, was about 0.18 to about 0.19 micron, then the second width, after the CD shrink etch, may be about 0.16 to about 0.17 micron. Similarly, if the first width was about 0.15 micron, the second width may be about 0.13 micron. If the first width was about 0.11 micron, the second width may be about 0.09 micron.

Figure 5D:
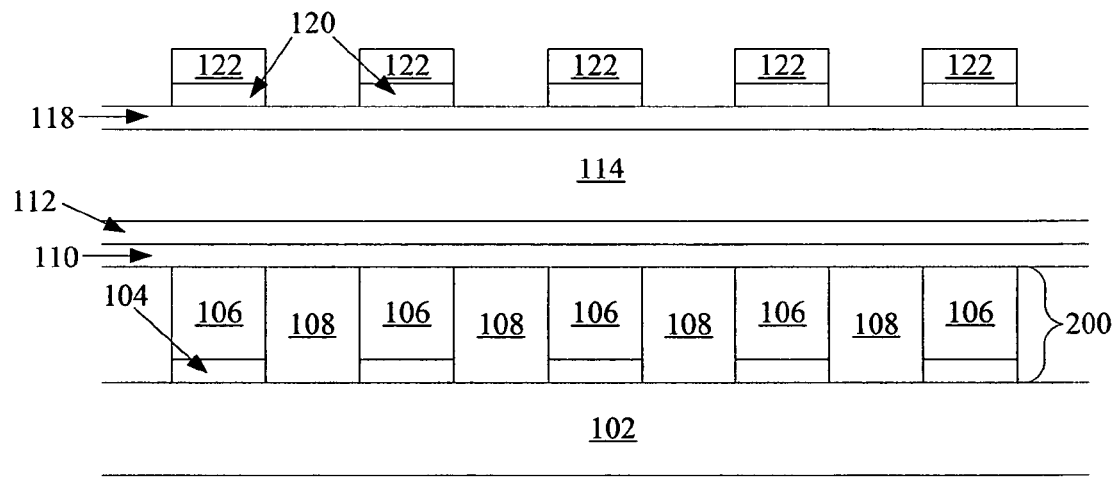

At this point the photoresist pillars 122 have been narrowed and BARC layer 120 has been etched through, as shown in FIG. 5d. (The drawings are designed to illustrate concept only, and should not be presumed to correctly portray scale or aspect ratio.) Next silicon dioxide layer 118 is etched. Finally a silicon etch etches polysilicon layers 114, and 112. Photoresist pillar 122 may have been partly etched away by the time this etch begins, but a thickness of BARC layer 120 beneath it and silicon dioxide layer 118 remain. Polysilicon etchants can be used that are highly selective to silicon dioxide, so silicon dioxide layer 118 functions as a hard mask. Barrier layer 110 of titanium nitride should be etched in this step as well.

To summarize, a method has been described for etching reduced CD pillars, the method comprising forming a layer of etchable material; forming a layer of photoresist over the etchable material; patterning and developing the photoresist layer to form a plurality of photoresist pillars, each photoresist pillar having a largest surface dimension equal to a first width, the first width no larger than about 0.3 micron; before etching the etchable material, shrinking the photoresist pillars until the largest surface dimension is a second width less than the first width; and etching the etchable material to form etched pillars.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Figure 5E:
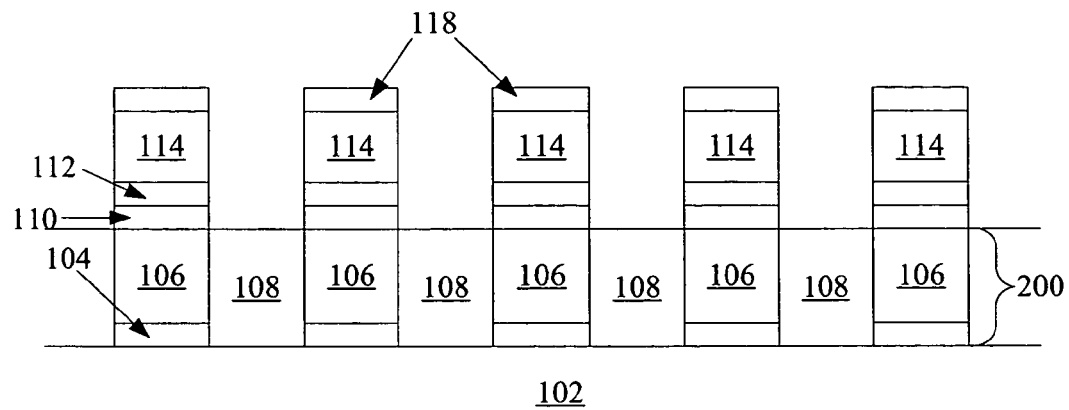

Once the etch is complete, a conventional ashing and clean process removes the remaining photoresist and BARC. The etched pillars, including silicon dioxide layer 118, polysilicon layers 112 and 114, and titanium nitride barrier layer 110, remain. The structure at this point is shown in FIG. 5e.

In this example, silicon dioxide layer 118 and BARC layer 120 compensated for the thickness of photoresist lost during the CD shrink etch, providing protection for underlying layers during the polysilicon etch. Skilled practitioners may choose to use or omit these layers, or substitute other materials for the same purpose. Such choices are routinely made by those skilled in the art.

Figure 5F:
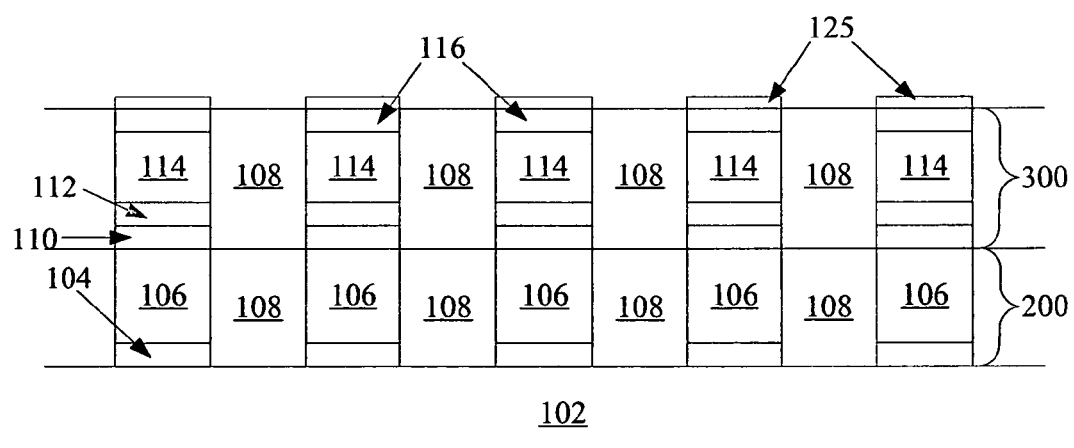

Turning to FIG. 5f, dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. An ion implantation step performed at this point creates heavily doped top regions 116, in this example using a p-type dopant to form a P+ region. After implantation, this layer will preferably have a dopant concentration of about $2 \times 10^{19}$ to about $4 \times 10^{21}$ atoms/cm$^3$, preferably about $8 \times 10^{20}$ atoms/cm$^3$.

In some embodiments a dielectric antifuse layer 125, preferably of silicon dioxide, is formed on heavily doped regions 116. In preferred embodiments, as shown, a silicon dioxide layer 125 is grown by oxidizing silicon at the tops of heavily doped regions 116 at about 600 to about 850 degrees C. for about 20 seconds to about two minutes, forming between about 15 and about 50 angstroms of silicon dioxide. Preferably, silicon dioxide layer 125 is formed by exposing the wafer to about 800 degrees for about one minute in an oxygen-containing ambient. Layer 125 could be deposited instead. As described in the '549 application, this dielectric antifuse layer need not always be present.

Overlying conductors can be formed in the same manner as the underlying conductors. The overlying conductors will be formed at a height above the height of the first conductors, and extend in a different direction from them, preferably substantially perpendicular to them.

To summarize, what has been described is a method for forming a memory array, the method comprising: forming a layer of etchable material; forming a layer of photoresist over the etchable material; patterning and developing the photoresist to form a plurality of photoresist features, each feature having a largest patterned dimension about equal to a first width, the first width less than about 0.3 micron; shrinking the features to a shrunk width, the shrunk width smaller than the first width; etching etched features in the etchable material; and forming the memory array comprising a plurality of memory cells, wherein each memory cell comprises one of the etched features.

At this point a first memory level has been formed. Additional memory levels can be monolithically formed above the first, as described in the '470, '549 applications and the other incorporated references, forming a monolithic three dimensional memory array. For example, a second plurality of pillars can be formed above the upper conductors, and a third plurality of conductors can be formed above them. The upper conductors of one memory level can serve as the lower conductors of an overlying memory level, or an interlevel dielectric can be formed between them.

What has been formed is a monolithic three dimensional memory array comprising: a) a first memory level formed over a substrate by a method comprising: i) forming a layer of polycrystalline or amorphous silicon; ii) depositing photoresist above the polycrystalline or amorphous silicon layer; iii) patterning and developing the photoresist to form a plurality of photoresist pillars arranged in an evenly spaced grid pattern, the largest patterned dimension of each pillar having about a first width; iv) before substantially etching the layer of polycrystalline or amorphous silicon, reducing the first width to a second width less than the first width; and v) etching the layer of polycrystalline or amorphous silicon to form etched silicon pillars; and b) a second memory level monolithically formed on the first level.

Such a monolithic three dimensional memory array can be formed by a method comprising: a) forming a first memory level by a method comprising: i) forming a first etchable layer; ii) forming a photoresist layer over the first etchable layer; iii) patterning and developing the photoresist layer to form photoresist pillars, each pillar having about a first width; iv) shrinking the photoresist pillars until each pillar has about a second width, the second width less than the first width; and v) etching the first etchable layer to form etched pillars; and b) monolithically forming a second memory level above the first memory level.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Herner, U.S. application Ser. No. 10/095,962, "Silicide-Silicon Oxide-Semiconductor Antifuse Device and Method of Making," filed Mar. 13, 2002; Petti et al., U.S. application Ser. No. 10/728,230, "Semiconductor Device Including Junction Diode Contacting Contact-Antifuse Unit Comprising Silicide," filed Dec. 3, 2003; Herner, U.S. application Ser. No. 10/954,510, "Memory Cell Comprising a Semiconductor Junction Diode Crystallized Adjacent to a Silicide," filed Sep. 29, 2004; and Petti, U.S. application Ser. No. 10/955,387, "Fuse Memory Cell Comprising a Diode, the Diode Serving as the Fuse Element," filed Sep. 29, 2004, all assigned to the assignee of the present invention and hereby incorporated by reference. As appropriate, the methods of the present invention can be used in conjunction with the memories described in these patents and applications to form monolithic three dimensional memory arrays according to the present invention.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or more memory levels can be formed above the substrate in such a multilevel array.

The present invention has been described herein in the context of a monolithic three dimensional memory array. It will be apparent to those skilled in the art, however, that the methods of the present invention can be employed advantageously whenever pillars having very small dimensions (smaller than 0.3 micron in every surface dimension, and especially smaller than 0.2 micron) are to be patterned and etched using conventional photolithography and etch processes. The methods of the present invention can be employed in two dimensional arrays, non-memory uses, and to pattern individual shapes, not formed in arrays.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a reduced CD pillar, the method comprising:

forming a conductor rail above a substrate, the conductor rail having a rail width;

forming a layer of etchable material above the conductor rail;

forming a layer of photoresist over the etchable material;

patterning and developing the photoresist layer to form a photoresist pillar having no cross-section width in any direction which is more than three times the cross-section width in any other direction, the photoresist pillar having a first width no larger than about 0.3 micron and having a first aspect ratio, wherein the photoresist pillar is adapted to survive mechanical stresses encountered during a wash-and-spin process, and wherein the first width is larger than the rail width;

spraying the photoresist layer with deionized water to stop the developing;

spinning the substrate to remove the deionized water;

shrinking the photoresist pillar to a second width smaller than the first width to form a shrunken photoresist pillar while controlling isotropy during the shrinking step by using an $O_2$ based etch and adjusting the $O_2$ percentage used to control isotropy, wherein the shrunken photoresist pillar has a second aspect ratio greater than the first aspect ratio, and wherein the second width is substantially equal to the rail width; and etching the etchable material to form an etched pillar, wherein the etched pillar is substantially aligned with the conductor rail and has a pillar width substantially equal to the rail width.

2. The method of claim 1 wherein the second width is less than about 95 percent of the first width and the shrinking step comprises etching the photoresist pillar with any etch and controlling isotropy during the etch.

3. The method of claim 2 wherein a degree of isotropy of the etching of the photoresist pillar is controlled to obtain a selected amount of reduction in the first width.

4. The method of claim 3 wherein shrinking step is performed using a combination of HBr and $O_2$ as an etchant and wherein the isotropy is controlled by adjusting the $O_2$ percentage used to etch the photoresist pillar.

5. The method of claim 4 wherein the second width is at least about 0.02 micron less than the first width.

6. The method of claim 1 wherein the etched pillar is substantially cylindrical.

7. The method of claim 1 wherein the etchable material comprises silicon or germanium.

8. The method of claim 1 further comprising forming a layer of bottom antireflective coating between the layer of etchable material and the layer of photoresist, and removing any of the coating not covered by the photoresist pillar during the shrinking step.

9. The method of claim 8 further comprising controlling isotropy to remove the coating not covered by the photoresist pillar while obtaining a selected amount of reduction in the first width of the photoresist pillar.

10. The method of claim 1 wherein the layer of etchable material is formed above a monocrystalline silicon substrate.

11. A method for etching a plurality of etched reduced CD pillars, the method comprising:
    forming a plurality of substantially parallel conductor rails above a substrate, each of the plurality of substantially parallel conductor rails having a rail width and being separated from an adjacent rail by a rail pitch;
    forming a layer of etchable material above the plurality of conductor rails;
    forming a layer of photoresist over the etchable material;
    patterning and developing the photoresist layer to form a plurality of photoresist pillars, each photoresist pillar having a largest surface dimension equal to a first width, the first width no larger than about 0.3 micron and having a first aspect ratio, wherein each photoresist pillar is adapted to survive mechanical stresses encountered during a wash-and-spin process, and wherein the first width is larger than the rail width;
    spraying the photoresist layer with deionized water to stop the developing;
    spinning the substrate to remove the deionized water;
    before etching the etchable material, shrinking the photoresist pillars to form shrunken photoresist pillars while varying isotropy during the shrinking step using an $O_2$ based etch and adjusting the $O_2$ percentage used to control isotropy until the largest surface dimension is a second width less than the first width, wherein each shrunken photoresist pillar has a second aspect ratio greater than the first aspect ratio, and wherein the second width is substantially equal to the rail width; and
    etching the etchable material to form the plurality of etched reduced CD pillars in a grid pattern, wherein each etched pillar is substantially aligned with one of the plurality of conductor rails, has a pillar width substantially equal to the rail width, and has a first pillar pitch in a direction perpendicular to the plurality of conductor rails substantially equal to the rail pitch.

12. The method of claim 11 wherein the shrinking step comprises etching the photoresist pillars and varying etch parameters during the etch to adjust isotropy.

13. The method of claim 12 wherein the isotropy of the etch is varied during the etch to obtain a selected amount of reduction in the first width.

14. The method of claim 13 wherein the shrinking step uses an HBr and $O_2$ etch and wherein isotropy is controlled by adjusting the $O_2$ percentage used in the etch of the photoresist pillars.

15. The method of claim 14 wherein the second width is at least about 0.02 micron less than the first width.

16. The method of claim 11 further comprising forming a layer of bottom antireflective coating between the layer of etchable material and the layer of photoresist, and etching the coating during the shrinking step.

17. The method of claim 16 further comprising adjusting isotropy to remove the coating not covered by the photoresist pillars while obtaining a selected amount of reduction in the first width of the photoresist pillars.

18. The method of claim 11 wherein the etched pillars are substantially cylindrical.

19. The method of claim 11 wherein the etched pillars are evenly spaced in the grid pattern, such that each pillar has a second pillar pitch in a direction parallel to the plurality of conductor rails substantially equal to the rail pitch.

20. The method of claim 19 wherein the etched pillars have first and second pitches of about 0.6 micron or less.

21. The method of claim 20 wherein the etched pillars have first and second pitches of about 0.36 micron or less.

* * * * *